United States Patent
Bourassa et al.

(10) Patent No.: US 9,470,759 B2
(45) Date of Patent: Oct. 18, 2016

(54) TEST INSTRUMENT HAVING A CONFIGURABLE INTERFACE

(75) Inventors: Stephen J. Bourassa, Tewksbury, MA (US); Michael Francis McGoldrick, North Reading, MA (US); David Kaushansky, Belmont, MA (US); Michael Thomas Fluet, Litchfield, NH (US)

(73) Assignee: Teradyne, Inc., North Reading, MA (US)

( * ) Notice: Subject to any disclaimer, the term of this patent is extended or adjusted under 35 U.S.C. 154(b) by 772 days.

(21) Appl. No.: 13/284,378

(22) Filed: Oct. 28, 2011

(65) Prior Publication Data

US 2013/0110446 A1    May 2, 2013

(51) Int. Cl.
  *G01R 31/00*  (2006.01)
  *G01R 31/319*  (2006.01)
  *G01R 31/28*  (2006.01)
  *G01R 31/317*  (2006.01)

(52) U.S. Cl.
  CPC ..... *G01R 31/31908* (2013.01); *G01R 31/2889* (2013.01); *G01R 31/31704* (2013.01); *G01R 31/31926* (2013.01)

(58) Field of Classification Search
  CPC ............ G06F 19/00; G01R 31/31926; G01R 31/31908; G01R 31/31704; G01R 31/2889
  USPC ....................................................... 702/122
  See application file for complete search history.

(56) References Cited

U.S. PATENT DOCUMENTS

| | | | |
|---|---|---|---|
| 5,883,852 A * | 3/1999 | Ghia et al. ............... | 365/230.05 |
| 6,044,481 A * | 3/2000 | Kornachuk et al. .......... | 714/724 |
| 6,363,506 B1 * | 3/2002 | Karri .............. | G01B 31/318371 |
| | | | 714/733 |
| 6,515,484 B1 * | 2/2003 | Bald et al. ..................... | 324/551 |
| 6,526,557 B1 * | 2/2003 | Young et al. ................... | 326/38 |
| 7,127,708 B2 * | 10/2006 | Gomez .......................... | 717/139 |
| 7,218,134 B1 * | 5/2007 | Ho .................................. | 326/16 |
| 7,536,679 B1 | 5/2009 | O'Connell et al. | |
| 7,733,096 B2 * | 6/2010 | Lin et al. ...................... | 324/550 |
| 7,949,916 B1 * | 5/2011 | Ang .............................. | 714/726 |

(Continued)

FOREIGN PATENT DOCUMENTS

| JP | 2009-031933 | 2/2009 |
|---|---|---|
| KR | 10-2009-0028569 | 3/2009 |

(Continued)

OTHER PUBLICATIONS

International search report and written opinion mailed Mar. 18, 3013 in international application No. PCT/US2012/056247, 10 pgs.

(Continued)

*Primary Examiner* — Gregory J Toatley
*Assistant Examiner* — Yoshihisa Ishizuka
(74) *Attorney, Agent, or Firm* — Choate, Hall & Stewart LLP

(57) ABSTRACT

In general, a test instrument includes a processing system programmed to control operation of the test instrument, including communication with a control system, and programmed to run one or more test programs to test a device interfaced to the test instrument, the processing system including multiple processing devices, and a configurable interface, through which communications are exchanged with the device interfaced to the test instrument, the configurable interface including physical ports, to which different configurations are assignable.

19 Claims, 4 Drawing Sheets

(56) References Cited

U.S. PATENT DOCUMENTS

| | | | |
|---|---|---|---|
| 8,103,992 B1* | 1/2012 | Chan et al. | 716/100 |
| 8,239,590 B1* | 8/2012 | Wennekamp et al. | 710/62 |
| 8,798,741 B2 | 8/2014 | Ryan et al. | |
| 2002/0171449 A1* | 11/2002 | Shimizu et al. | 324/765 |
| 2003/0084388 A1* | 5/2003 | Williamson et al. | 714/725 |
| 2003/0206535 A1* | 11/2003 | Shpak | H04L 47/245 370/328 |
| 2003/0233208 A1 | 12/2003 | Uesaka et al. | |
| 2004/0036493 A1* | 2/2004 | Miller | G01R 1/07314 324/754.14 |
| 2004/0175850 A1* | 9/2004 | Shimizu et al. | 438/14 |
| 2004/0181763 A1 | 9/2004 | Soltis et al. | |
| 2005/0047339 A1* | 3/2005 | Dube et al. | 370/230 |
| 2005/0093571 A1* | 5/2005 | Suaris et al. | 326/37 |
| 2005/0129033 A1* | 6/2005 | Gordy et al. | 370/401 |
| 2005/0171722 A1 | 8/2005 | Fritzsche | |
| 2005/0182588 A1* | 8/2005 | Chenoweth et al. | 702/118 |
| 2005/0193266 A1 | 9/2005 | Subramanian et al. | |
| 2005/0204223 A1* | 9/2005 | Ong | 714/724 |
| 2005/0237073 A1* | 10/2005 | Miller et al. | 324/754 |
| 2005/0262412 A1 | 11/2005 | Mukai et al. | |
| 2006/0028897 A1* | 2/2006 | Vernenker et al. | 365/230.01 |
| 2006/0100812 A1 | 5/2006 | Sturges et al. | |
| 2006/0156288 A1 | 7/2006 | Jones et al. | |
| 2006/0242504 A1 | 10/2006 | Kadota | |
| 2006/0273809 A1* | 12/2006 | Miller et al. | 324/754 |
| 2007/0162729 A1* | 7/2007 | Ryu et al. | 712/241 |
| 2007/0176807 A1* | 8/2007 | Mattes et al. | 341/118 |
| 2007/0245289 A1* | 10/2007 | Suaris et al. | 716/16 |
| 2007/0261009 A1* | 11/2007 | Granicher et al. | 716/1 |
| 2007/0277154 A1 | 11/2007 | Badwe | |
| 2008/0250288 A1 | 10/2008 | Souef et al. | |
| 2008/0274629 A1* | 11/2008 | Meyer | 439/49 |
| 2008/0278190 A1* | 11/2008 | Ong et al. | 324/765 |
| 2008/0297167 A1* | 12/2008 | Possa | 324/537 |
| 2009/0024381 A1 | 1/2009 | Sakamoto et al. | |
| 2009/0066365 A1* | 3/2009 | Solomon | 326/41 |
| 2009/0091347 A1* | 4/2009 | Gohel et al. | 324/765 |
| 2009/0101940 A1* | 4/2009 | Barrows et al. | 257/204 |
| 2009/0112548 A1 | 4/2009 | Conner | |
| 2009/0119542 A1 | 5/2009 | Nagashima et al. | |
| 2009/0128162 A1 | 5/2009 | Singleton et al. | |
| 2009/0138567 A1* | 5/2009 | Hoover et al. | 709/215 |
| 2009/0217311 A1 | 8/2009 | Kocyan et al. | |
| 2009/0299677 A1* | 12/2009 | Torres | 702/118 |
| 2010/0058274 A1* | 3/2010 | Pike et al. | 716/16 |
| 2010/0146338 A1* | 6/2010 | Schalick et al. | 714/33 |
| 2010/0164527 A1 | 7/2010 | Weyh et al. | |
| 2010/0174955 A1* | 7/2010 | Carnevale et al. | 714/718 |
| 2010/0180169 A1 | 7/2010 | La Fever et al. | |
| 2010/0287424 A1* | 11/2010 | Kwon | 714/718 |
| 2010/0313071 A1 | 12/2010 | Conner | |
| 2011/0067040 A1 | 3/2011 | Nagahara et al. | |
| 2011/0291693 A1* | 12/2011 | Ong et al. | 324/762.01 |
| 2012/0198279 A1 | 8/2012 | Schroeder | |
| 2013/0031276 A1* | 1/2013 | Rathi et al. | 710/8 |
| 2013/0070640 A1* | 3/2013 | Chapman | 370/254 |

FOREIGN PATENT DOCUMENTS

| | | |
|---|---|---|
| KR | 10-2009-0107579 | 10/2009 |
| WO | 2010/054669 | 5/2010 |

OTHER PUBLICATIONS

International Preliminary Report on Patentability mailed May 8, 2014 in corresponding international application No. PCT/US2012/056247, 7 pgs.

J.L. Anderson Jr., "Test application program interface for instrumentation", In: Autotestcon, IEEE, Sep. 21, 2006, pp. 272-276, See abstract; p. 273, paragraph 3: and figure 1.

Authorized officer Sung Cheal Byun, International Search Report and Written Opinion mailed Jan. 30, 2013 in international application No. PCT/US2012/056250, 9 pgs.

Search Report mailed Feb. 24, 2015 in European application No. 12843264.8, 6 pgs.

Search Report mailed Feb. 24, 2015 in European application No. 12843399.2, 7 pgs.

Search Report mailed Jan. 29, 2015 in European application No. 12842878.6, 8 pgs.

Majid et al., "Stretching the limits of FPGA SerDes for enhanced ATE performance", School of Electrical and Computer Engineering Georgia Institute of Technology, Atlanta, GA, USA (2010), 6 pgs.

International Search Report mailed Mar. 18, 2013 in International Application No. PCT/US2012/056245, 9 pgs.

International Preliminary Report on Patentability mailed May 8, 2014 in International Application No. PCT/US2012/056245, 6 pgs.

* cited by examiner

TEST INSTRUMENT HAVING A CONFIGURABLE INTERFACE

TECHNICAL FIELD

This disclosure relates generally to a test instrument having a configurable interface.

BACKGROUND

Automatic test equipment (ATE) plays a role in the manufacture of electronics, such as semiconductor devices and circuit board assemblies. Manufacturers generally use automatic test equipment, or "tester instruments", to verify the operation of devices during the manufacturing process. Such devices are referred to as a "device under test" (DUT) or a "unit under test" (UUT). Early detection of faults eliminates costs that would otherwise be incurred by processing defective devices, and thus reduces the overall costs of manufacturing. Manufacturers also use ATE to grade various specifications. Devices can be tested and binned according to different levels of performance in areas, such as speed. Devices can be labeled and sold according to their actual levels of performance.

SUMMARY

In general, in one aspect, a test instrument includes a processing system programmed to control operation of the test instrument, including communication with a control system, and programmed to run one or more test programs to test a device interfaced to the test instrument, the processing system including multiple processing devices, and a configurable interface, through which communications are exchanged with the device interfaced to the test instrument, the configurable interface including physical ports, to which different configurations are assignable.

In general, in another aspect a method includes configuring a processing system to control operation of a test instrument, including communication with a control system, the configuring including programming the processing system to run one or more test programs to test a device interfaced to the test instrument, the processing system including multiple processing devices. The method further includes providing a configurable interface, through which communications are exchanged with the device interfaced to the test instrument, the configurable interface including physical ports, to which different configurations are assignable.

Aspects may include one or more of the following features. The configurable interface includes programmable logic, the logic being programmable through application of a load to the logic, the load providing functionality that enables the physical ports to assume the different configurations. The programmable logic includes a field programmable gate array (FPGA), and the load is a single load that enables the physical ports to assume the different configurations in response to control inputs. The single load further configures the FPGA to perform one or more tests on the device interfaced to the test instrument. Different configurations are assignable to the physical ports based, at least in part, on which of the multiple processing devices is communicating with the device interfaced to the test instrument. The processing system is programmed to provide the control inputs to the FPGA. The different configurations relate to functions of the ports, including whether ports operate as inputs or outputs. The different configurations relate to widths of the ports. The different configurations relate to frequencies of signals transmitted through the ports. The different configurations relate to memory depth associated with the ports. The processing system includes a first processing sub-system that is programmable to run one or more test programs to test a device interfaced to the test instrument, and that is programmed to control operation of the test instrument, a second processing sub-system that is dedicated to device testing, the second processing system including multiple processing devices that are programmable to run one or more test programs to test the device.

Two or more of the features described in this disclosure/, including this summary section, may be combined to form embodiments not specifically described herein.

The systems and techniques described herein, or portions thereof, may be implemented as a computer program product that includes instructions that are stored on one or more non-transitory machine-readable storage media, and that are executable on one or more processing devices. The systems and techniques described herein, or portions thereof, may be implemented as an apparatus, method, or electronic system that may include one or more processing devices and memory to store executable instructions to implement the stated functions.

The details of one or more implementations are set forth in the accompanying drawings and the description below. Other features, objects, and advantages will be apparent from the description and drawings, and from the claims.

DETAILED DESCRIPTION

Described herein is a test instrument that includes an interface that is configurable. The test instrument includes a processing system, which may include multiple processing devices. The processing system is programmed to control operation of the test instrument. The processing system is also programmed to run one or more test programs to test a device interfaced to the test instrument. The test instrument includes a configurable interface, through which communications are exchanged with the device interfaced to the test instrument (e.g., a unit under test, or "UUT"). In this example, implementation, the configurable interface includes physical ports, to which different configurations are assignable. In this example implementation, the interface is configurable in real-time using a single program image that includes multiple selectable interface configurations.

Figure 1:
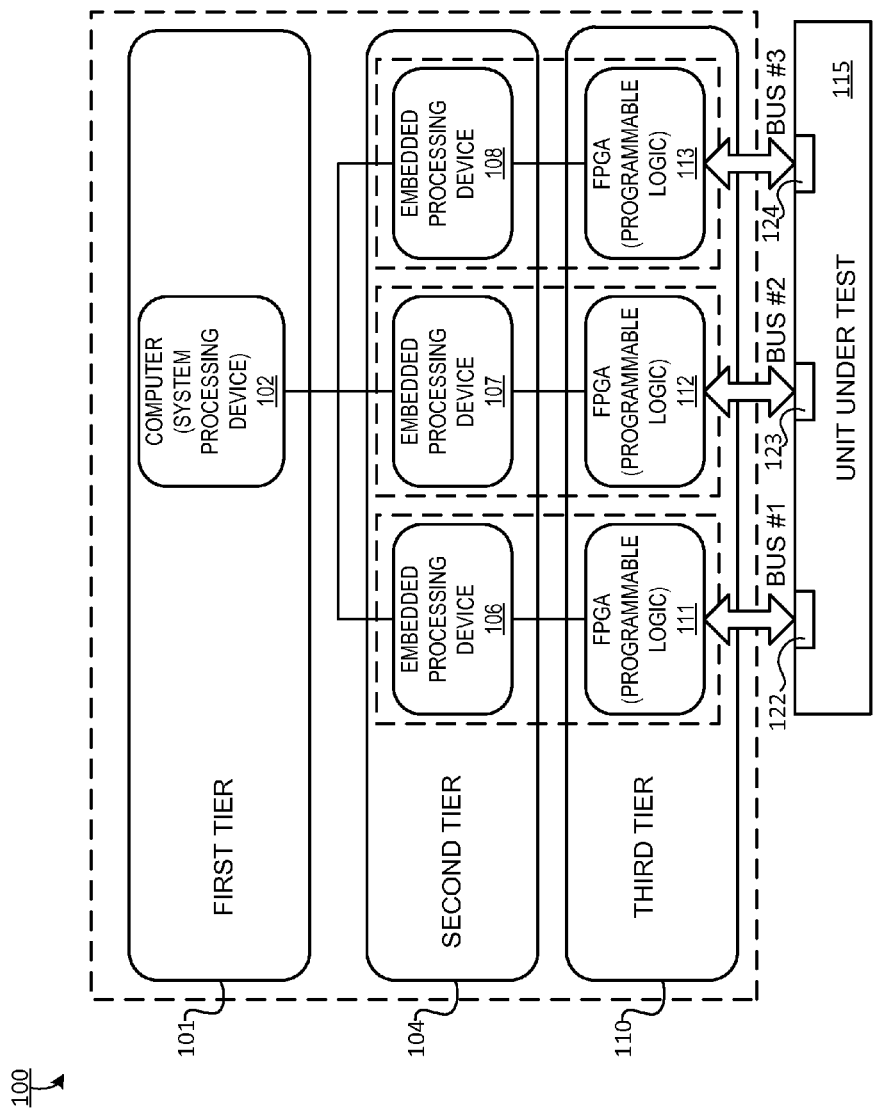
FIG. 1 is a block diagram of an example test instrument

FIG. 1 is a block diagram of an example implementation of the foregoing test instrument 100. In FIG. 1, test instrument 100 includes a three-tiered processing system. However, in other example implementations, there may be more, or less, tiers. The different tiers of test instrument 100 reflect the relative relationship of the tiers to the UUT. In this example, first tier 101 includes a computer 102. In this example, computer 102 includes a system processing device that controls various features of test instrument 100, such as communication with an external network. In addition, computer 102 is programmable to perform various testing operations, as described below. Second tier 104 includes one or more processing devices 106 to 108 that are dedicated to testing. For example, processing devices 106 to 108 typically do not perform non-test functions like test instrument control and network communication. In some examples, however, processing devices 106 to 108 may perform some housekeeping functions, such as communication and flow of control, interrupts, timing, and the like. Third tier 110 includes logic 111 to 113 that is programmable both to act as an interface to a UUT 115 and to perform one or more test operations on the UUT.

In this example first tier 101, computer 102 includes one or more processing devices, such as one or more microprocessors or a single multi-core microprocessor (not shown). Computer 102 also includes memory (not shown) that stores executable code to control test instrument communication with the external environment, and to perform various "housekeeping" functions to control operation of test instrument 100. For example, computer 102 may be responsible for exchanging communications between the test instrument and one or more external entities over a network interface 120, scanning the test instrument for malware, memory management, power control, and other functions that are not specifically related to testing the UUT.

Computer 102 is also programmable to perform test operations on a UUT (e.g., 115) interfaced to test instrument 100. The test operations may include, but are not limited to, testing bus speed, reaction time, or any other appropriate operational aspects of the UUT. In general, the testing that is performed is dependent upon the type of device being tested, and the information sought during testing.

One or more test programs may be loaded into memory on computer 102, and executed by processing device(s) in computer 102 in order to perform the testing. While performing testing, computer 102 may continue to perform other functions, such as those described above, to keep test instrument 100 operational. Consequently, the test latency (e.g., the amount of time between the start of a test and receipt of test results) can be on the order of milliseconds. This is but an example of the test latency. In different systems, numerous factors may have an effect on test latency, such as the speed of the processing device(s) in computer 102, the amount of memory available in computer 102 to run the test programs, and so forth.

A possible advantage of performing testing via computer 102 relates to development costs of test programs. More specifically, computer 102 may run an operating system (OS), such as MICROSOFT® WINDOWS® or any other relatively user-friendly, operating system. Tools available for development of test programs on such an operating system are typically widely available, and generally well known to test program developers. As a result, the cost of developing test programs on computer 102, to run on computer 102, can be less than the cost of developing test programs to run on the other tiers of the multi-tiered architecture. This generalization, however, may not apply in all cases.

In this example, second tier 104 includes multiple embedded processing devices 106 to 108. Here, three embedded processing devices are shown; however, test instrument 100 may include any appropriate number of embedded processing devices, e.g., one, two, four, five or more. These processing devices are embedded in the sense that they are incorporated into test instrument 100; and are dedicated to performing test functions (e.g., to testing UUTs interfaced to test instrument 100). Embedded processing devices 106 to 108 typically are not responsible for test instrument operations like the "housekeeping" operations described above that are performed by computer 102. However, in some implementations, embedded processing devices 106 to 108 may be programmed to perform one or more such operations, or other operations not specifically directed to testing UUTs.

Each embedded processing device 106 to 108 may include, e.g., a microcontroller or a microprocessor having a single core or multiple cores. Each microprocessor is programmable, either directly or via computer 102. For example, a user of test instrument 100 may interact with the operating system of computer 102 to program an embedded processing device 106. Alternatively, there may a direct interface, e.g., hardware or software, through which each embedded processing device may be programmed. Programming, in this context, refers to storing one or more test programs onto a respective embedded processing device, which can be executed on that embedded processing device to test a UUT.

As shown in FIG. 1, each embedded processing device is interfaced to computer 102 and to respective programmable logic (in this example, a field programmable gate array (FPGA)). As explained below, each FPGA acts as an interface to a separate UUT (not shown) or to a portion of a single UUT (e.g., a bus 122, 123, 124 on that UUT, as shown) for testing. Accordingly, in this example, each embedded processing device may be programmed with a test program designed specifically for the corresponding UUT, or portion thereof being tested. As noted, an appropriate test program may be loaded directly into the embedded processing device or it may be loaded via computer 102. Each embedded processing device may execute its own test program separately, and concurrently with, other embedded processing devices. In some implementations, there may be coordination among the embedded processing devices as to how their respective test programs are to be executed. Such coordination may be implemented by the embedded processing device themselves or by computer 102. In some implementations, the coordination may involve devices at different tiers of the architecture. In some implementations, the different embedded processing devices 106 to 108 may implement different portions (e.g., modules) of the same test program, with or without appropriate coordination.

A possible advantage of performing testing via an embedded processing device relates to test latency. More specifically, because the embedded processing devices are primarily dedicated to testing, their resources are not typically taxed by other tasks. As a result, testing latency can be less than that achieved by computer 102. For example, test latency for an embedded processing device can be on the order of microseconds. This, however, is but an example of embedded processing device test latency. In different systems, numerous factors may have an effect on test latency, such as processing device speed, the amount of memory available to run the test programs, and so forth. Accordingly, the foregoing generalization may not apply in all cases.

Furthermore, tools are available for development of test programs on the embedded processing devices. As a result, the cost of developing test programs on an embedded processing device, to run on an embedded processing device, can be less than the cost of developing test programs to run on hardware, such as an FPGA.

Third tier 110 includes programmable logic, e.g., FPGAs 111 to 113, although other types of programmable logic may be used in lieu of FPGAs. Each FPGA is configured by loading a program image into the FPGA. This program image is referred to as an "FPGA load". In this example, each FPGA is configured to act as an interface between a UUT, or portion thereof (e.g., a UUT bus) and test instrument 100. For example, an FPGA may specify a port width, port speed, the number of input ports, the number of output ports, and so forth.

First tier 101 computing device(s) (e.g., computer 102) and second tier 104 computing device(s) (e.g., embedded processing devices 106 to 108) access UUT 115 through third tier 110. For example, as shown in FIG. 1, each embedded processing device may communicate with UUT 115 through a corresponding FPGA. Computer 102 may communicate with UUT 115 through one or more FPGAs, depending upon which UUT, or portion of a UUT, is being currently tested. In some implementations, each interface implemented by an FPGA is programmable. In other implementations, the interface implemented by each FPGA is static (e.g., not programmable).

Each FPGA may also be configurable to perform one or more tests on a corresponding UUT, or portion thereof to which the FPGA is interfaced. For example, the FPGA load for each FPGA may include one or more test routines that are run by the FPGA to test various aspects of the UUT. As above, the routines that are implemented depend upon the device being tested, and the information sought during testing. Test routines run by each FPGA may be run independently of other test routines run by other FPGAs, or there may be coordination among the various FPGAs. Each FPGA may execute its own test routine separately, and concurrently with, other embedded processing devices. In some implementations, there may be coordination among the FPGAs as to how their respective test programs are to be executed. Such coordination may be implemented by the FPGAs themselves, by their corresponding embedded processing devices, or by computer 102. In some implementations, the coordination may involve devices at different tiers of the architecture. For example, computer 102, in concert with embedded processing devices 106 to 108, may coordinate operation of respective FPGAs 111 to 113. In some implementations, the different FPGAs may implement different portions (e.g., modules) of the same test routine, with or without appropriate coordination.

A possible advantage of performing testing via an FPGA relates to test latency. More specifically, because the FPGAs are hardware devices, they are able to run at higher speeds than the test routines programmed into either the embedded processing devices 106 to 108 or computer 102. As a result, testing latency can be less than that achieved by embedded processing devices 106 to 108 or computer 102. For example, test latency for a programmable device can be on the order of nanoseconds. This, however, is but an example of FPGA test latency. In different systems, numerous factors may have an effect on test latency. Accordingly, the foregoing generalization may not apply in all cases.

In some implementations, testing may be performed exclusively by one tier or another of the architecture. For example, computer 102 may be programmed to run one or more test programs to test a UUT, while devices on other tiers of the architecture do not perform UUT tests. Embedded processing devices 106 to 108 may be programmed to run one or more test programs to test a UUT, while devices on other tiers of the architecture do not perform UUT tests. FPGAs 111 to 113 may be configured to run one or more tests on the device, while devices on other tiers of the architecture do not perform UUT tests. Devices that are not performing tests are not necessarily dormant during this time. For example, computer 102 may continue to perform the housekeeping operations described above; the FPGAs may continue to route data to/from the UUT (i.e., to act as interfaces to the UUT); and the embedded processing devices may continue be active in coordination or other communication (e.g., transmitting test results from the FPGAs to computer 102).

In other implementations, testing may be performed by different tiers of the architecture concurrently or in concert. For example, two or more of computer 102, embedded processing devices 106 to 108, and FPGAs 111 to 113 may act in coordination, at the same time or within the same test sequence, to perform one or more test operations on a single UUT or on multiple UUTs. To effect such coordination, appropriate programming is loaded into computer 102 and/or embedded processing devices 106 to 108, and/or an appropriate image is loaded into the FPGAs. By way of example, a first test may be performed on a UUT by computer 102; a second test may be performed on the UUT by embedded processing device 106; and a third test may be performed on the UUT by FPGA 111. The first, second and third tests may be separate tests, or part of the same test sequence. Data from the first, second and third tests may be combined, e.g., in computer 102, and processed to obtain the appropriate test results. These test results may be sent to an external computer (not shown) for analysis and reporting. Any of tier of the architecture or another (e.g., third party) party computer (not shown) may perform the coordination.

In implementations where one or more tiers of the architecture have not been programmed, the unprogrammed tiers may be bypassed (at least as far as their test functionality is concerned). The unprogrammed tiers may be pre-programmed or pre-configured to perform various functions, such as those described above relating to programming and communication among the tiers and with an external network.

Devices at the various tiers may be programmed or configured in real-time. In this context, "real-time" includes programming at test time or shortly before test time. That is, the test instrument need not come pre-programmed with test programs that are to be run on a UUT. Those test programs may be incorporated into the instrument at the appropriate time. Existing test programs on the test instrument may likewise be replaced with new test programs, as appropriate.

Figure 2:
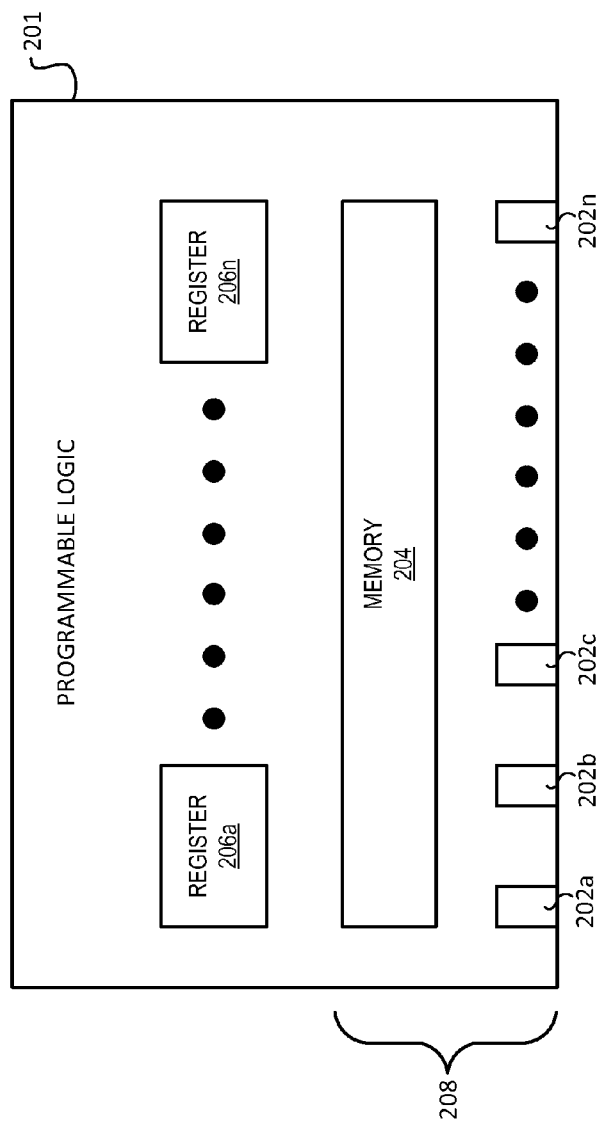
FIG. 2 is a block diagram showing example programmable logic.

FIG. 2 shows an example of programmable logic 201, which may be part of test instrument 100. Programmable logic 201 may be, e.g., an FPGA as described above, or any other appropriate type of programmable logic. In this context, the programmable logic includes an interface 208 to a UUT. Interface 208 includes components (e.g., ports, memory, or the like) that are used in exchanging data with a connected UUT. The interface is configurable in the sense that different elements of the interface may be assigned different roles based on stored configuration information, as described below. Advantageously, the interface may be configurable in real-time in the sense that it can be configured as different tests are performed on a UUT, e.g., using different routines or by different devices.

In this example, programmable logic 201 includes multiple test channels. Each test channel corresponds to a physical port 202a to 202n. Each physical port may correspond to an interface element, such as a pin or a slot, on the programmable logic. These physical ports are structured to interface to a mating connector of a UUT. In this example, programmable logic 201 includes 128 physical ports; however, in other examples, different numbers of physical ports may be used.

Memory 204 (e.g., random access memory—"RAM") may be associated with each of the physical ports. This memory may be part of the same contiguous memory space, as shown, or it may be parts of different memory spaces. Test data may be transferred from memory 204, through the physical ports, to a UUT. Test results data may be transferred from the UUT, through the physical ports, to memory 204. As explained above with respect to FIG. 1, testing may be initiated, and controlled by, device(s) in first tier 101, second tier 104, and/or third tier 110 (which, in this example, included the programmable logic 201). Test data may therefore be received, at memory 204, from component(s) on any appropriate tier, and test results data may be transferred, from memory 204, to component(s) on any appropriate tier.

Each physical port may operate at a frequency dictated by one of multiple port clocks (not shown). In this example, the port clocks may be generated by circuitry (e.g., a processing device in one of the multiple tiers) in test instrument 100, or the port clocks may be generated based on a clock provided at an external input to the test instrument. The physical ports may operate at different frequencies. For example, physical ports 202a to 202n may operate at a first frequency, physical ports 202a to 202n may operate at second frequency, and so forth. In this example, operation at a frequency includes the rate at which data is transferred across a port.

Programmable logic 201 also includes registers 206a to 206n. Registers 206a to 206n store configuration information, such as settings and other data, that may be used to configure an interface 208 of programmable logic 201 to the UUT. More specifically, aspects of interface 208 are configurable to accommodate different processing devices, different test routines or protocols, and so forth. For example, each physical port may be configured to operate as an input port, an output port, or both an input and output port.

Port widths may be configured. For example, multiple physical ports may be grouped to create one or more multi-bit ports. For example, the 128 physical ports in the example above may be configured to operate together as a single 128-bit port, to operate as two 64-bit ports, to operate as four 32-bit ports, to operate as one 32-bit port and one 96-bit port, and so forth. The physical ports may be grouped in any appropriate manner to create such multi-bit ports.

Port memory depth may be configured. For example, the depth of each port (both physical and multi-bit ports) can be set separately based on the amount of memory 204 available to the ports. By way of example, 1024 megabytes (MB) of memory 204 could be divided equally as 256 MB to be allocated each of four multi-bit (e.g., 32-bit) ports. That same 1024 MB of memory 204 could be divided into a block of 512 MB and four blocks of 128 MB. The 512 MB may be allocated to one multi-bit port, and the 128 MB may be allocated to each of four other multi-bit ports. In this example, port memory depth will typically not exceed the amount of available memory. If the configuration for the port memory depth exceeds the amount of available memory, additional memory may be made available from elsewhere on the programmable logic. Alternatively, the configuration may not be permitted.

The frequency of each port (both physical and multi-bit ports) may be configurable. For example, appropriate clocks, such as those described above, may be associated with each port and may be used to control the frequencies at which signals are transmitted through those port(s). For example, the actual clock frequencies may be used to control the ports, or stepped-up or stepped-down versions of those clock frequencies may be used to control the ports. In some implementations, the ports may be configured to operate at between, for example, 10 megahertz (MHz) and 400 MHz. Frequencies other than these, however, may be used.

Different test routines or protocols may use different port configurations. The different port configurations may be based on configuration information stored in registers 206a to 206n. In this regard, in the FPGA example, a single FPGA load may specify multiple configurations for multiple tests to be performed by the test instrument. The multiple configurations may specify, per test, e.g., port width, port speed (e.g., 10 MHz to 400 MHz), the number of input ports, the number of output ports, memory depth, port groupings, and any other appropriate configuration parameter associated with configuring the interface to the UUT. In some implementations, different configurations may apply to different test routines or protocols regardless of the processing device on which they are implemented, or different configurations may apply to different devices regardless of the test routines or protocols that they implement.

As noted above, configuration information for an interface may be stored in one or more registers (e.g., registers 206a to 206n) of the programmable logic. When a test is initiated, e.g., from the programmable logic or from another processing device associated with the test instrument (e.g., from tiers 101 or 104), the appropriate interface configuration may be obtained from the appropriate register. The configuration may be test-specific or processing-device specific. As noted, configurations may be stored for the different tiers or processing devices within the tiers, or different configurations may be stored for different testing programs or protocols regardless of the processing device on which they are executed.

Interface configuration information may be stored, in each register (or elsewhere), associating an interface configuration with a UUT test or device. When a test is initiated, the programmable logic (e.g., the FPGA) may be instructed, e.g., by test code run outside of the programmable logic (e.g., on a system processing device or an embedded processing device) to retrieve the information from the appropriate register, and to associate a configuration of the interface with the test. In that configuration, the interface is operated in the configuration appropriate for the test. When testing is initiated from the programmable logic itself, a similar process may be performed.

By way of example, assume that a test program running on an embedded processing device 106 requires an interface of FPGA 111 (of which programmable logic 201 is an example) to bus 122 of UUT 115 to have a single 128-bit port with a memory depth of 1054 MB. In this example, appropriate information may be obtained from an appropriate register 206a, and FPGA 111 may operate the interface accordingly. Configuration and operation of different interfaces to the same UUT (e.g., interfaces to buses 122, 123 and 124) may be coordinated, or the configuration and operation of those interfaces may be separate. For example, the same register (or registers) may specify that each of multiple interfaces to the same UUT is to be configured in like manner for a particular test program or test device. Alternatively, different interfaces may have different configurations for the same UUT, test program, device, etc.

Advantageously, in the foregoing example implementations, the FPGA load need not be changed in order to reconfigure the test instrument interface to the DUT. That is, the same FPGA load may specify different configurations for the interface, and those interface configurations may be selected based on the test that is to be performed on the UUT. For example, in these example implementations, the same FPGA load contains configuration information for multiple interface configurations (e.g., the configuration information that is stored in the registers) Accordingly, in these example implementations, there is no need to apply a different program image to the programmable logic in order to reconfigure the test instrument interface(s). In other example implementations, different program images may be applied to perform the reconfiguration.

Figure 3:
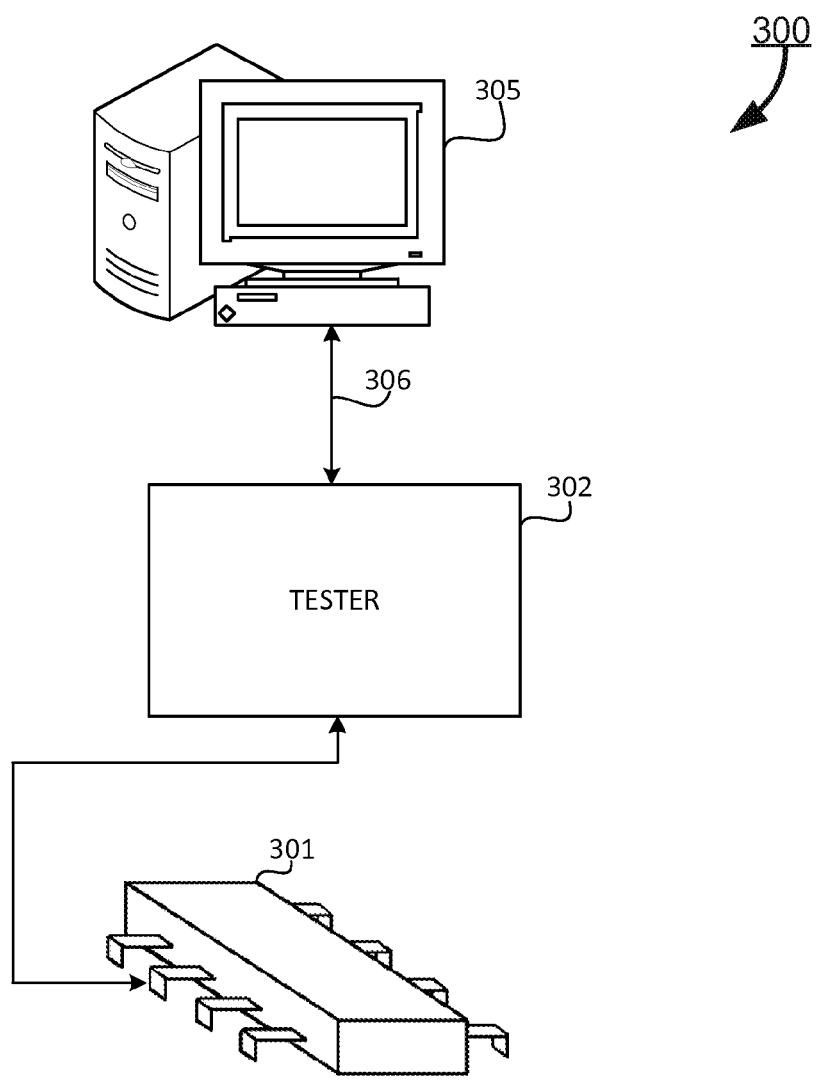
FIG. 3 is a block diagram of an example test system.

Referring now to FIG. 3, that figure shows an example of a system on which the architecture may be implemented. FIG. 3 shows an example test system 300 for testing a UUT 301. Test system 300 includes a tester 302, which may have the multi-tiered architecture of FIG. 1 or 2. To interact with tester 302, system 300 includes a computer system 305 that interfaces with tester 302 over a network connection 306. As noted below, computer system 305 may incorporate the functionality of computer 102 (FIG. 1) or it may be an external computer that interacts with computer 102 on the test instrument. Typically, computer system 305 sends commands to tester 302 to initiate execution of routines and programs for testing UUT 301. Such executing test programs may initiate the generation and transmission of test signals to the UUT 301 and collect responses from the UUT. Various types of UUTs may be tested by system 300. For example, UUTs may be avionics, radar, weaponry, semiconductor devices, and so forth.

To provide test signals and collect responses from the UUT, tester 302 is connected, via an appropriate FPGA interface, to one or more connector pins that provide an interface for the internal circuitry of UUT 301. For illustrative purposes, in this example, device tester 302 is connected to a connector pin of UUT 301 via a hardwire connection to deliver test signals (to the internal circuitry of UUT 301). Device tester 302 also senses signals at UUT 301 in response to the test signals provided by device tester 302. For example, a voltage signal or a current signal may be sensed at a UUT pin in response to a test signal. Such single port tests may also be performed on other pins included in UUT 301. For example, tester 302 may provide test signals to other pins and collect associated signals reflected back over conductors (that deliver the provided signals). In some examples, by collecting the reflected signals, the input impedance of the pins may be characterized along with other single port testing quantities. In other test scenarios, a digital signal may be sent to UUT 301 for storage on UUT 301. Once stored, UUT 301 may be accessed to retrieve and send the stored digital value to tester 302. The retrieved digital value may then be identified to determine if the proper value was stored on UUT 301.

Along with performing one-port measurements, a two-port test may also be performed by device tester 302. For example, a test signal may be injected to a pin on UUT 301 and a response signal may be collected from one or more other pins of UUT 301. This response signal is provided to device tester 302 to determine quantities, such as gain response, phase response, and other throughput measurement quantities.

Figure 4:
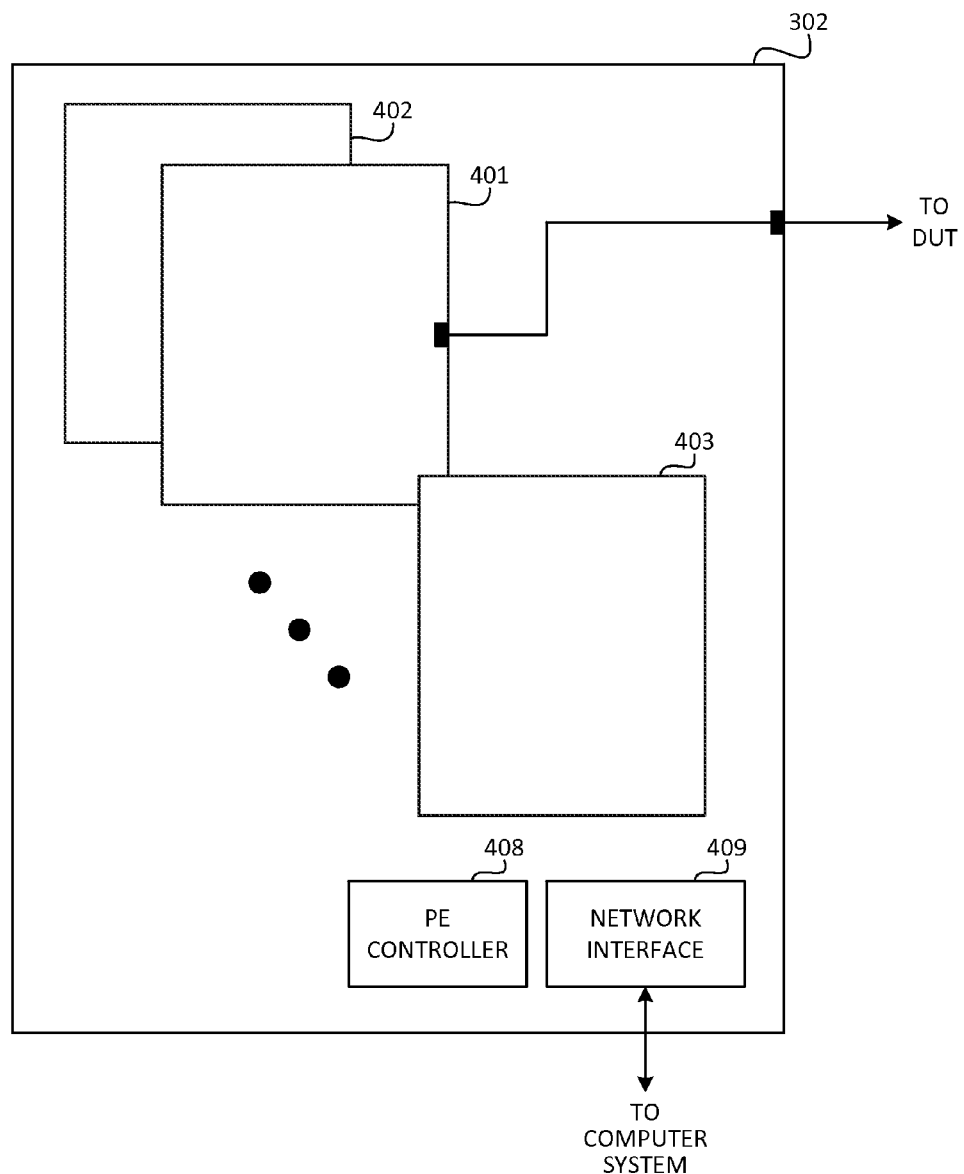
FIG. 4 is a block diagram of an example tester included in the test system.

Referring also to FIG. 4, to send and collect test signals from multiple connector pins of a UUT (or multiple UUTs), device tester 302 includes an interface card 401 that can communicate with numerous pins. For example, interface card 401 includes the one or more FPGAs described herein, which may be used to transmit test signals to the UUT and to collect corresponding responses. Each communication link to a pin on the UUT may constitute a channel and, by providing test signals to a large number of channels, testing time may be reduced since multiple tests may be performed simultaneously. Along with having many channels on an interface card, by including multiple interface cards in tester 302, the overall number of channels increases, thereby further reducing testing time. In this example, two additional interface cards 402 and 403 are shown to demonstrate that multiple interface cards may populate tester 302.

Each interface card may include dedicated integrated circuit circuitry, including, e.g., an FGPA and embedded processing device (as described, e.g., FIG. 1), for performing particular test functions. This circuitry may implement, e.g. a pin electronics (PE) stage for performing PE tests, and a parametric measurement unit (PMU) stage for performing tests. Typically PMU testing involves providing a (programmable) DC voltage or current signal to the UUT to determine such quantities as input and output impedance, current leakage, and other types of DC performance characterizations. PE testing involves sending DC or AC test signals, or waveforms, to a UUT (e.g., UUT 301) and collecting responses to further characterize the performance of the UUT. For example, the PE stage may transmit (to the UUT) AC test signals that represent a vector of binary values for storage on the UUT. Once these binary values have been stored, the UUT may be accessed by tester 302 to determine if the correct binary values have been stored.

In some arrangements, an interface device may be used to connect one or more conductors from tester 302 to the UUT. For example, the UUT may connect to an Interface Test Adapter (ITA) which interfaces with an Interface Connection Adapter (ICA) that connects with the tester. The UUT (e.g., UUT 301) may be mounted onto a device interface board (DIB) for providing access to each UUT pin. In such an arrangement, a UUT conductor may be connected to the DIB for placing test signals on the appropriate pin(s) of the UUT. Additionally, in some arrangements, tester 302 may connect to two or more DIBs for interfacing the channels provided by interface cards 401 to 403 to one or multiple UUTs.

To initiate and control the testing performed by interface cards 401 to 403, tester 302 includes a PE controller 408 (e.g., in a system processing device, in an embedded processing device, or in programmable logic) to provide test parameters (e.g., test signal voltage level, test signal current level, digital values, etc.) for producing test signals and analyzing UUT responses. Tester 302 also includes a network interface 409 that allows computer system 305 to control the operations executed by tester 302 and also allows data (e.g., test parameters, UUT responses, etc.) to pass between tester 302 and to computer system 305.

The computer system, or another processing device used on or associated with test system 300, may be configured to exchange communications with a test program running on tester 302 through active communication channels with the device tester. The computer system may be, or include, computer 102 of FIG. 1. Alternatively, computer 102 may be part of tester 302 and the computer system described with respect to FIG. 4 may communicate with computer 102.

The foregoing describes performing testing using a system processing device, embedded processing devices, or programmable logic. However, testing, as described herein, may be performed using a combination of system processing device, embedded processing devices, or programmable logic. For example, each of these different elements may run on or more test programs simultaneously to test the same device or portion thereof. Likewise, these different elements may coordinate testing so that, e.g., a system processing device (e.g., 102 of FIG. 1) performs a first part of a test sequence, an embedded processing device (e.g., 106 of FIG. 1) performs a second part of the same testing sequence, and programmable logic (e.g., FPGA 111 of FIG. 1) performs a third part of the same testing sequence. Any appropriate coordination may take place between the different programmable elements of the test instrument described herein.

Furthermore, in some implementations, a tier of processing may be circumvented. For example, testing may occur using a system processing device (e.g., 102) and programmable logic (e.g., FPGA 111), but not an embedded processing device. In such implementations, communications between the system processing device and the programmable logic may pass through an embedded processing device or bypass the embedded processing device tier altogether.

In some implementations, there may be more than three tiers of processing devices. For example, there may two tiers of embedded processing devices (resulting, e.g., in four tiers total). For example, a single embedded processing device may be used to coordinate testing of a single device, and different embedded processing devices (under the direction of that single embedded processing device) may be used to test different aspects or features of that single device.

In some implementations, one or more tiers of processing devices may be eliminated from the system of FIG. 1. For example, some implementations may not include a tier of embedded processing devices. In such example systems, there may be only a system processing device (e.g., 102 of FIG. 1) and programmable logic (e.g., FPGAs 111 to 113. In this regard, any appropriate combination of tiers may be employed in the test instrument described herein.

In some implementations, the system processing device (e.g., 102 of FIG. 1) may be external to the test instrument. For example, an external computer may be employed to control operations of the test instrument, and may interact with embedded processing device(s) and programmable logic on the test instrument in the manner described herein. In other implementations, the system processing device may be part of the test instrument or remote from the test instrument (e.g., connected to the test instrument over a network).

In some implementations, the programmable logic may be replaced with non-programmable logic. For example, rather than using an FPGA, one or more application-specific integrated circuits (ASICs) may be incorporated into the test instrument in place of, or in addition to, the programmable logic described herein.

The functionality described herein, or portions thereof, and its various modifications (hereinafter "the functions"), are not limited to the hardware described herein. All or part of the functions can be implemented, at least in part, via a computer program product, e.g., a computer program tangibly embodied in an information carrier, such as one or more non-transitory machine-readable media, for execution by, or to control the operation of, one or more data processing apparatus, e.g., a programmable processor, a computer, multiple computers, and/or programmable logic components.

A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a network.

Actions associated with implementing all or part of the functions can be performed by one or more programmable processors executing one or more computer programs to perform the functions of the calibration process. All or part of the functions can be implemented as, special purpose logic circuitry, e.g., an FPGA and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. Components of a computer include a processor for executing instructions and one or more memory devices for storing instructions and data.

Components of different embodiments described herein may be combined to form other embodiments not specifically set forth above. Components may be left out of the circuitry shown in FIGS. 1 to 4 without adversely affecting its operation. Furthermore, various separate components may be combined into one or more individual components to perform the functions described herein.

Other embodiments not specifically described herein are also within the scope of the following claims.

What is claimed is:

1. A test instrument comprising:
a processing system programmed to control operation of the test instrument, including communication with a control system, and programmed to run one or more test programs to test a device interfaced to the test instrument, the processing system comprising multiple processing devices, the processing system comprising a first processing system and a second processing system, with the second processing system being between the device interfaced to the test instrument and the first processing system; and
programmable logic between the second processing system and the device interfaced to the test instrument, the programmable logic comprising a configurable interface, through which communications are exchanged with the device interfaced to the test instrument, the configurable interface comprising physical ports, to which different configurations are assignable based on whether the first processing system or the second processing system is executing a test program to test the device interfaced to the test instrument, the different configurations being assignable in real-time during execution of the test program;
wherein the first processing system, the second processing system, and the programmable logic are each configured to perform testing on the device interfaced to the test instrument, with the second processing system having less test latency than the first processing system, and the programmable logic having less test latency than the first processing system and the second processing system.

2. The test instrument of claim 1, wherein the programmable logic is programmable through application of a load to the programmable logic, the load providing functionality that enables the physical ports to assume the different configurations.

3. The test instrument of claim 2, wherein the programmable logic comprises a field programmable gate array (FPGA); and
wherein the load is a single load that enables the physical ports to assume the different configurations in response to control inputs.

4. The test instrument of claim 3, wherein the single load further configures the FPGA to perform one or more tests on the device interfaced to the test instrument.

5. The test instrument of claim 3, wherein the processing system is programmed to provide the control inputs to the FPGA.

6. The test instrument of claim 1, wherein the different configurations relate to functions of the ports, including whether ports operate as inputs or outputs.

7. The test instrument of claim 1, wherein the different configurations relate to widths of the ports.

8. The test instrument of claim 1, wherein the different configurations relate to frequencies of signals transmitted through the ports.

9. The test instrument of claim 1, wherein the different configurations relate to memory depth associated with the ports.

10. The test instrument of claim 1, wherein the first processing system is programmable to run one or more test programs to test the device interfaced to the test instrument, and is programmed to control operation of the test instrument; and wherein the second processing system is dedicated to device testing, the second processing system comprising multiple processing devices that are programmable to run one or more test programs to test the device interfaced to the test instrument.

11. A method comprising:

configuring a processing system comprised of multiple processing devices to control operation of a test instrument, including communication with a control system, the configuring comprising programming the processing system to run one or more test programs to test a device interfaced to the test instrument, the processing system comprising a first processing system and a second processing system, with the second processing system being between the first processing system and the device interfaced to the test instrument; and configuring a configurable interface implemented in programmable hardware, through which communications are exchanged with the device interfaced to the test instrument, the configurable interface comprising physical ports, to which different configurations are assignable based on whether the first processing system or the second processing system is executing a test program to test the device interfaced to the test instrument, the different configurations being assignable in real-time during execution of the test program;

wherein the first processing system, the second processing system, and the programmable hardware are each configured to perform testing on the device interfaced to the test instrument, with the second processing system having less test latency than the first processing system, and the programmable hardware having less test latency than the first processing system and the second processing system.

12. The method of claim 11, wherein the configurable interface comprises programmable logic, the programmable logic being programmable through application of a load to the logic, the load providing functionality that enables the physical ports to assume the different configurations.

13. The method of claim 12, wherein the programmable logic comprises a field programmable gate array (FPGA); and wherein the load is a single load that enables the physical ports to assume the different configurations in response to control inputs.

14. The method of claim 13, wherein the single load further configures the FPGA to perform one or more tests on the device interfaced to the test instrument.

15. The method of claim 11, wherein the different configurations relate to functions of the ports, including whether ports operate as inputs or outputs.

16. The method of claim 11, wherein the different configurations relate to widths of the ports.

17. The method of claim 11, wherein the different configurations relate to frequencies of signals transmitted through the ports.

18. The method of claim 11, wherein the different configurations relate to memory depth associated with the ports.

19. The method of claim 11, wherein the first processing system is programmable to run one or more test programs to test the device interfaced to the test instrument, and is programmed to control operation of the test instrument; and wherein the second processing system is dedicated to device testing, the second processing system comprising multiple processing devices that are programmable to run one or more test programs to test the device interfaced to the test instrument.

* * * * *